United States Patent
Hatakeyama et al.

(10) Patent No.: US 6,461,791 B1
(45) Date of Patent: Oct. 8, 2002

(54) POLYMERS, CHEMICAL AMPLIFICATION RESIST COMPOSITIONS AND PATTERNING PROCESS

(75) Inventors: Jun Hatakeyama; Yuji Harada; Jun Watanabe; Mutsuo Nakashima, all of Nakakubiki-gun (JP)

(73) Assignee: Shin-Etsu Chemical Co., Ltd. (JP)

( * ) Notice: Subject to any disclaimer, the term of this patent is extended or adjusted under 35 U.S.C. 154(b) by 0 days.

(21) Appl. No.: 09/686,955

(22) Filed: Oct. 12, 2000

(30) Foreign Application Priority Data

Oct. 13, 1999 (JP) .............................. 11-291558

(51) Int. Cl.$^7$ .............................. G03F 7/039; C08J 5/22
(52) U.S. Cl. .................... 430/270.1; 430/311; 430/325; 430/326; 430/330; 521/27; 526/242
(58) Field of Search .............................. 430/270.1, 311, 430/325, 326, 330; 521/27; 526/242

(56) References Cited

U.S. PATENT DOCUMENTS

| | | | |
|---|---|---|---|
| 4,491,628 A | | 1/1985 | Ito et al. |
| 5,602,185 A | * | 2/1997 | Stone et al. .................. 521/27 |
| 5,843,624 A | | 12/1998 | Houlihan et al. |
| 5,891,603 A | * | 4/1999 | Kodama et al. ......... 430/270.1 |
| 5,968,713 A | | 10/1999 | Nozaki et al. |
| 5,998,099 A | | 12/1999 | Houlihan et al. |
| 6,013,416 A | | 1/2000 | Nozaki et al. |

FOREIGN PATENT DOCUMENTS

| | | |
|---|---|---|
| JP | 63-27829 | 2/1988 |
| JP | 2-27660 | 6/1990 |
| JP | 9-73173 | 3/1997 |
| JP | 9-230595 | 9/1997 |
| JP | 10-10739 | 1/1998 |
| WO | WO 97/33198 | 9/1997 |
| WO | WO 99/24497 | * 5/1999 |

* cited by examiner

*Primary Examiner*—Janet Baxter
*Assistant Examiner*—Amanda C. Walke
(74) *Attorney, Agent, or Firm*—Millen, White, Zelano, & Branigan, P.C.

(57) ABSTRACT

Polymers of a fluorinated backbone having recurring units of formula (1) are novel:

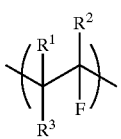

(1)

$R^1$ is H, F, $C_{1-20}$ alkyl or fluorinated $C_{1-20}$ alkyl, $R^2$ is F, $C_{1-20}$ alkyl or fluorinated $C_{1-20}$ alkyl, and $R^3$ is $C_{6-20}$ aryl which may have attached thereto a hydroxyl group and/or a hydroxyl group substituted with an $OR^4$ group wherein $R^4$ is an acid labile group. Using such polymers, resist compositions featuring transparency to excimer laser light and alkali solubility are obtained.

34 Claims, No Drawings

POLYMERS, CHEMICAL AMPLIFICATION RESIST COMPOSITIONS AND PATTERNING PROCESS

This invention relates to polymers useful as the base polymer in chemical amplification resist compositions suited for microfabrication. It also relates to chemical amplification resist compositions comprising the polymers, and a patterning process using the same.

BACKGROUND OF THE INVENTION

In the drive for higher integration and operating speeds in LSI devices, the pattern rule is made drastically finer. The rapid advance toward finer pattern rules is grounded on the development of a projection lens with an increased NA, a resist material with improved performance, and exposure light of a shorter wavelength. In particular, the change-over from i-line (365 nm) to shorter wavelength KrF laser (248 nm) brought about a significant innovation, enabling mass-scale production of 0.18 micron rule devices. To the demand for a resist material with a higher resolution and sensitivity, acid-catalyzed chemical amplification positive working resist materials are effective as disclosed in U.S. Pat. Nos. 4,491,628 and 5,310,619 (JP-B 2-27660 and JP-A 63-27829). They now become predominant resist materials especially adapted for deep UV lithography.

Resist materials adapted for KrF excimer lasers enjoyed early use on the 0.3 micron process, went through the 0.25 micron rule, and currently entered the mass production phase on the 0.18 micron rule. Engineers have started investigation on the 0.15 micron rule, with the trend toward a finer pattern rule being accelerated. A wavelength change-over from KrF to shorter wavelength ArF laser (193 nm) is expected to enable miniaturization of the design rule to 0.13 μm or less. Since conventionally used novolac resins and polyvinylphenol resins have very strong absorption in proximity to 193 nm, they cannot be used as the base resin for resists. To ensure transparency and dry etching resistance, some engineers investigated acrylic and alicyclic (typically cycloolefin) resins as disclosed in JP-A 9-73173, JP-A 10-10739, JP-A 9-230595 and WO 97/33198. With respect to $F_2$ excimer laser (157 nm) which is expected to enable further miniaturization to 0.10 μm or less, more difficulty arises in insuring transparency because it was found that acrylic resins are not transmissive to light at all and those cycloolefin resins having carbonyl bonds have strong absorption.

SUMMARY OF THE INVENTION

An object of the invention is to provide a novel polymer having a high transmittance to vacuum ultraviolet radiation of up to 300 nm, especially an $F_2$ excimer laser beam (157 nm), $Kr_2$ excimer laser beam (146 nm), KrAr excimer laser beam (134 nm) and $Ar_2$ excimer laser beam (126 nm), and useful as the base polymer in a chemical amplification resist composition. Another object is to provide a chemical amplification resist composition comprising the polymer, and a patterning process using the same.

It has been found that using a resin based on a polystyrene derivative of a fluorinated backbone comprising recurring units of the general formula (1) defined below, especially a polymer comprising recurring units of the general formula (2) defined below, a resist material featuring transparency and alkali solubility is obtained.

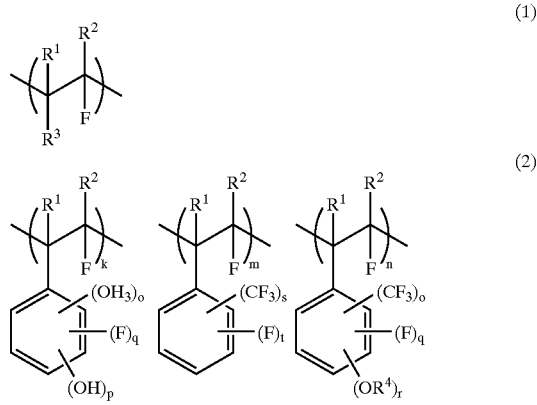

Herein $R^1$ is hydrogen, fluorine or an unsubstituted or fluorinated, straight, branched or cyclic alkyl group of 1 to 20 carbon atoms; $R^2$ is fluorine or an unsubstituted or fluorinated, straight, branched or cyclic alkyl group of 1 to 20 carbon atoms; $R^3$ is an aryl group of 6 to 20 carbon atoms which may have attached thereto a hydroxyl group and/or a hydroxyl group substituted with an $OR^4$ roup; $R^4$ is an acid labile group; letters o, p, q, r, s and t are numbers in the range: $0 \leq o < 5$, $0 < p \leq 5$, $0 \leq q < 5$, $0 \leq r \leq 5$, $0 \leq s \leq 5$, $0 \leq t \leq 5$, $0 < o+q < 5$, and $0 \leq s+t \leq 5$, k, m and n are numbers in the range: $0 < k < 1$, $0 \leq m < 1$, and $0 \leq n < 1$.

As long as the inventor has confirmed, polyvinyl phenol is somewhat improved in transmittance near 160 nm, but far below the practical level, and reducing carbonyl and carbon-to-carbon double bonds is essential for insuring a transmittance.

However, cyclic structures and carbon-to-carbon double bonds greatly contribute to an improvement in dry etching resistance. A polymer for use with an ArF excimer laser, in which a benzene ring is excluded and instead, an alicyclic structure is introduced for improving etching resistance, is difficult to provide transparency since it acquires solubility by relying on carboxylic acid. The inventor has found that use of a fluorine-substituted polystyrene derivative is effective for improving transparency while maintaining the desired dry etching resistance. Specifically, among halogen atoms, fluorine atoms are effective for improving transparency whereas chlorine atoms are not effective and bromine atoms detract from transparency. The effect is obtained whether the position of fluorine substitution is on the benzene ring or on the polymer backbone.

What becomes a problem as a result of wavelength reduction is a lowering of transparency, and in the case of a positive resist material, a negative working phenomenon that the exposed areas become insoluble as the dose of exposure is increased. Those portions which have turned negative are insoluble not only in alkali developers, but also in organic solvents such as acetone. This indicates that gel forms as a result of crosslinking of molecules together. Radical generation is probably one cause of crosslinking. As a result of wavelength reduction, the exposure energy is increased so that even C—C bonds and C—H bonds may be excited in the case of $F_2$ exposure (157 nm). As a result of excitation, radicals are generated with a possibility that molecules are bonded together. For polymers having an alicyclic structure for use in ArF exposure, for example, polynorbornene, an outstanding negative working phenomenon was observed. It is believed that these polymers have a structure susceptible to crosslinking since the alicyclic group has many C—H bonds at the bridgehead. On the other hand, it is well known that α-methylstyrene and derivatives thereof are effective for preventing crosslinking. Alpha-methylstyrene can mitigate the negative working phenomenon, but fail to completely eliminate the phenomenon. Moreover, since oxygen absorption is considerable in the VUV region, exposure is effected under the conditions that oxygen is purged, with an inert gas such as nitrogen or argon, to an oxygen concentration of 1 ppm or lower. Since oxygen is an effective radical trapping agent, this means that the radicals generated have a long lifetime and more crosslinking takes place. Since the energy of C—F bonds is greater than the energy of C—C bonds and C—H bonds, the C—F bonds are less damageable upon exposure. In particular, fluorination of the backbone is effective to prevent crosslinking.

In a first aspect, the invention provides a polymer comprising a polystyrene derivative of a fluorinated backbone having recurring units of the following general formula (1).

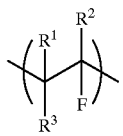
(1)

Herein $R^1$ is hydrogen, fluorine or an unsubstituted or fluorinated, straight, branched or cyclic alkyl group of 1 to 20 carbon atoms; $R^2$ is fluorine or an unsubstituted or fluorinated, straight, branched or cyclic alkyl group of 1 to 20 carbon atoms; $R^3$ is an aryl group of 6 to 20 carbon atoms which may have attached thereto a hydroxyl group and/or a hydroxyl group substituted with an $OR^4$ group; and $R^4$ is an acid labile group.

The invention also provides a polymer comprising recurring units of the following general formula (2).

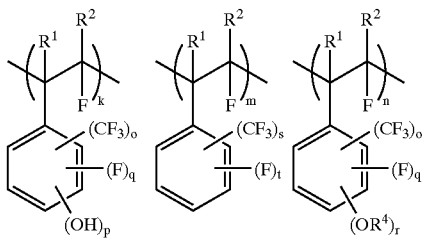
(2)

Herein $R^1$, $R^2$ and $R^4$ are as defined above, letters o, p, q, r, s and t are numbers in the range: $0 \leq o < 5$, $0 < p \leq 5$, $0 \leq q < 5$, $0 \leq r \leq 5$, $0 \leq s \leq 5$, $0 \leq t \leq 5$, $0 < o + q < 5$, and $0 \leq s + t \leq 5$, k, m and n are numbers in the range: $0 < k < 1$, $0 \leq m < 1$, and $0 \leq n < 1$.

In another aspect, the invention provides a photoresist composition comprising the polymer defined above.

One embodiment of the invention is a chemical amplification, positive resist composition comprising (A) the polymer defined above, (B) an organic solvent, and (C) a photoacid generator.

Another embodiment of the invention is a chemical amplification, negative resist composition comprising (A) the polymer defined above, (B) an organic solvent, (C) a photoacid generator, and (D) a crosslinker.

In either embodiment, the resist composition may further include (E) a basic compound and/or (F) a dissolution inhibitor.

In a further aspect, the invention provides a process for forming a pattern, comprising the steps of applying the resist composition defined above onto a substrate to form a coating; heat treating the coating and exposing the coating to high energy radiation with a wavelength of up to 300 nm or electron beam through a photo-mask; optionally heat treating the exposed coating, and developing the coating with a developer.

DESCRIPTION OF THE PREFERRED EMBODIMENT

Polymer

According to the invention, the polymer or high molecular weight compound is defined as comprising a polystyrene derivative of a fluorinated backbone having recurring units of the following general formula (1).

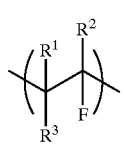
(1)

Herein $R^1$ is a hydrogen atom, a fluorine atom, a straight, branched or cyclic alkyl group of 1 to 20 carbon atoms, or a fluorinated, straight, branched or cyclic alkyl group of 1 to 20 carbon atoms. $R^2$ is a fluorine atom, a straight, branched or cyclic alkyl group of 1 to 20 carbon atoms, or a fluorinated, straight, branched or cyclic alkyl group of 1 to 20 carbon atoms.

The straight, branched or cyclic alkyl groups represented by $R^1$ are those of 1 to 20 carbon atoms, preferably 1 to 12 carbon atoms, and more preferably 1 to 10 carbon atoms, including methyl, ethyl, propyl, isopropyl, n-butyl, sec-butyl, tert-butyl, cyclopentyl, cyclohexyl, 2-ethylhexyl, and n-octyl. The fluorinated alkyl groups correspond to the foregoing alkyl groups in which some or all of the hydrogen atoms are replaced by fluorine atoms and include, for example, trifluoromethyl, 2,2,2-trifluoroethyl, 3,3,3-trifluoropropyl, and 1,1,2,3,3,3-hexafluoropropyl.

$R^3$ is an aryl group of 6 to 20 carbon atoms which may have attached thereto a hydroxyl group and/or a hydroxyl group substituted with an $OR^4$ group wherein $R^4$ is an acid labile group. Illustrative examples of the $R^3$ group are represented by the following formula.

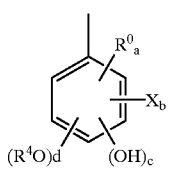

Herein $R^0$ is a straight, branched or cyclic alkyl group of 1 to 14 carbon atoms or a fluorinated, straight, branched or cyclic alkyl group of 1 to 14 carbon atoms, examples of which are as exemplified above; X is a fluorine atom; $R^4$ is an acid labile group; letters a, b, c and d each are an integer of 0 to 5, and a+b+c+d is equal to 0 to 5.

Of the polymers of the invention, polymers comprising recurring units of the following general formula (2) are preferable.

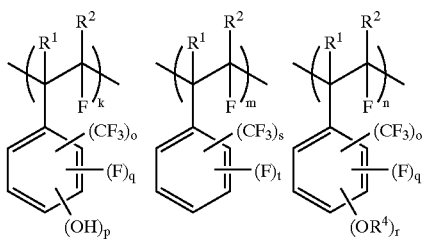
(2)

Herein $R^1$ and $R^2$ are as defined above, $R^4$ is an acid labile group, letters o, p, q, r, s and t are numbers in the range: $0 \leq o < 5$, $0 < p \leq 5$, $0 \leq q < 5$, $0 \leq r \leq 5$, $0 \leq s \leq 5$, $0 \leq t \leq 5$, $0 < o + q < 5$, and $0 \leq s + t \leq 5$, k, m and n are numbers in the range: $0 < k < 1$, $0 \leq m < 1$, and $0 \leq n < 1$.

The acid labile group represented by $R^4$ is selected from a variety of such groups, preferably from among the groups of the following formulae (3) and (4), tertiary alkyl groups with 4 to 40 carbon atoms of the following formula (5), trialkylsilyl groups whose alkyl groups each have 1 to 6 carbon atoms, and oxoalkyl groups of 4 to 20 carbon atoms.

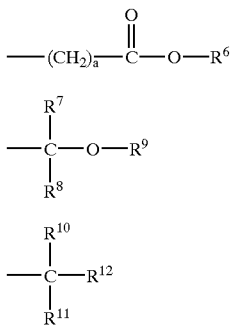

(3)

(4)

(5)

In formulae (3) and (4), $R^6$ and $R^9$ are monovalent hydrocarbon groups, such as straight, branched or cyclic alkyl groups of 1 to 20 carbon atoms, which may contain a hetero atom such as oxygen, sulfur, nitrogen or fluorine. $R^7$ and $R^8$ are hydrogen or straight, branched or cyclic alkyl groups of 1 to 20 carbon atoms, which may contain a hetero atom such as oxygen, sulfur, nitrogen or fluorine. A pair of $R^7$ and $R^8$, a pair of $R^7$ and $R^9$ or a pair of $R^8$ and $R^9$, taken together, may form a ring. Letter "a" is an integer of 0 to 10. More preferred groups represented by $R^6$ to $R^9$ are shown below.

In formula (3), $R^6$ is a tertiary alkyl group of 4 to 20 carbon atoms, preferably 4 to 15 carbon atoms, a trialkylsilyl group whose alkyl groups each have 1 to 6 carbon atoms, an oxoalkyl group of 4 to 20 carbon atoms or a group of formula (5). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-5-oxooxoran-4-yl. Letter "a" is an integer of 0 to 6.

In formula (4), $R^7$ and $R^8$ are independently hydrogen or straight, branched or cyclic alkyl groups of 1 to 18 carbon atoms, preferably 1 to 10 carbon atoms, for example, methyl, ethyl, propyl, isopropyl, n-butyl, sec-butyl, tert-butyl, cyclopentyl, cyclohexyl, 2-ethylhexyl and n-octyl. $R^9$ is a monovalent hydrocarbon group of 1 to 18 carbon atoms, preferably 1 to 10 carbon atoms, which may have a hetero atom (e.g., oxygen atom), for example, straight, branched or cyclic alkyl groups, and such groups in which some hydrogen atoms are replaced by hydroxyl, alkoxy, oxo, amino or alkylamino groups. Illustrative examples of the substituted alkyl groups are given below.

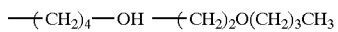

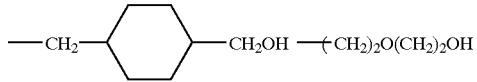

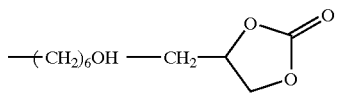

A pair of $R^7$ and $R^8$, a pair of $R^7$ and $R^9$, or a pair of $R^8$ and $R^9$, taken together, may form a ring. Each of $R^7$, $R^8$ and $R^9$ is a straight or branched alkylene group of 1 to 18 carbon atoms, preferably 1 to 10 carbon atoms, when they form a ring.

Illustrative examples of the acid labile groups of formula (3) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Of the acid labile groups of formula (4), illustrative examples of the straight or branched groups are given below.

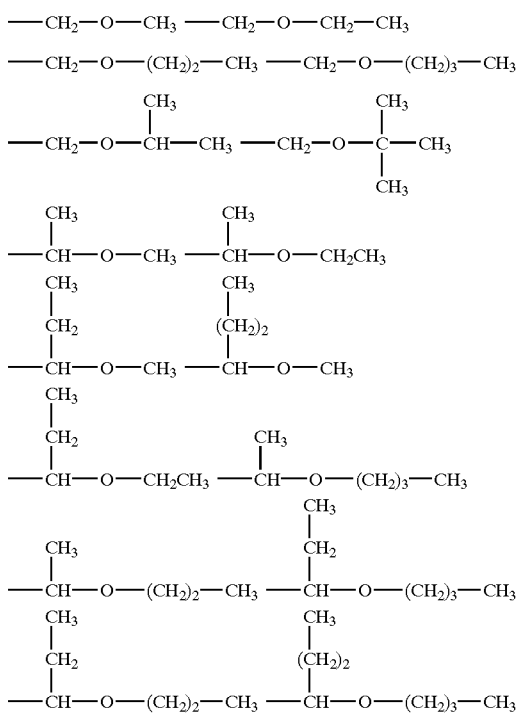

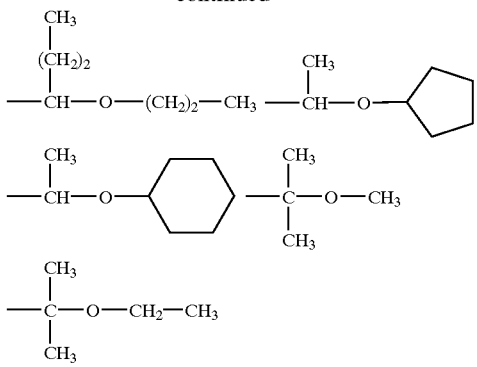

Of the acid labile groups of formula (4), illustrative examples of the cyclic groups include tetrahydrofuran-2-yl, 2-methyltetrahydrofuran-2-yl, tetrahydropyran-2-yl and 2-methyltetrahydropyran-2-yl. Preferred among the groups of formula (4) are ethoxyethyl, butoxyethyl and ethoxypropyl.

In formula (5), $R^{10}$, $R^{11}$ and $R^{12}$ are independently monovalent hydrocarbon groups, for example, straight, branched or cyclic alkyl groups of 1 to 20 carbon atoms, which may contain a hetero atom such as oxygen, sulfur, nitrogen or fluorine. A pair of $R^{10}$ and $R^{11}$, a pair of $R^{10}$ and $R^{12}$, or a pair of $R^{11}$ and $R^{12}$, taken together, may form a ring.

Examples of the tertiary alkyl group represented by formula (5) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Other illustrative examples of the tertiary alkyl group are given below as formulae (5-1) through (5-16).

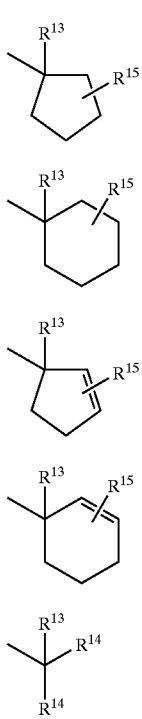

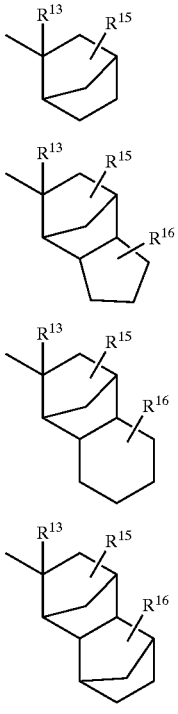

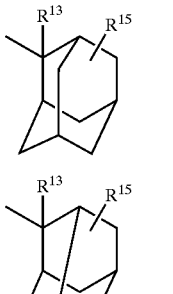

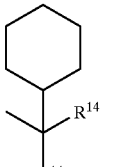

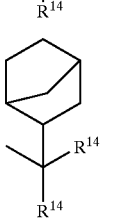

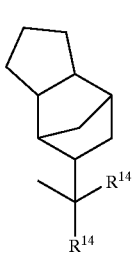

(5-15)

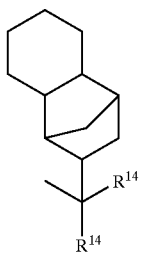

(5-16)

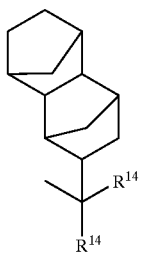

Herein, $R^{13}$ and $R^{14}$ are independently straight, branched or cyclic alkyl groups of 1 to 6 carbon atoms, for example, methyl, ethyl, propyl, isopropyl, n-butyl, sec-butyl, n-pentyl, n-hexyl, cyclopropyl and cyclopropylmethyl. $R^{15}$ is hydrogen or a monovalent hydrocarbon group of 1 to 6 carbon atoms which may contain a hetero atom or a monovalent hydrocarbon group of 1 to 6 carbon atoms, typically alkyl, which may be separated by a hetero atom. The hetero atom is an oxygen, sulfur or nitrogen atom, which is contained or intervenes in the form of —OH, —OR, —O—, —S—, —S(=O)—, —NH$_2$, —NHR, —NR$_2$, —NH—, or —NR— wherein R is an alkyl group of 1 to 20 carbon atoms, and especially 1 to 16 carbon atoms.

$R^{16}$ is hydrogen or an alkyl, hydroxyalkyl, alkoxyalkyl, alkoxy or alkoxyalkyl group of 1 to 20 carbon atoms, especially 1 to 16 carbon atoms, which may be straight, branched or cyclic. Illustrative examples include methyl, hydroxymethyl, ethyl, hydroxyethyl, propyl, isopropyl, n-butyl, sec-butyl, n-pentyl, n-hexyl, methoxy, methoxymethoxy, ethoxy, and tert-butoxy.

Of the acid labile group represented by $R^4$, the trialkylsilyl groups whose alkyl groups each have 1 to 6 carbon atoms include trimethylsilyl, triethylsilyl, and tert-butyldimethylsilyl.

The oxoalkyl groups of 4 to 20 carbon atoms include 3-oxocyclohexyl and groups of the following formulae.

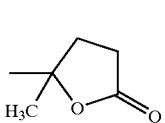

The acid labile group represented by $R^4$ may be an acetal crosslinking group represented by formula (11a) or (11b):

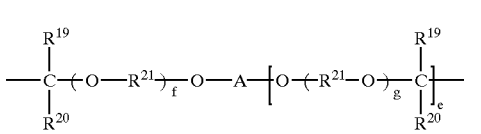 (11a)

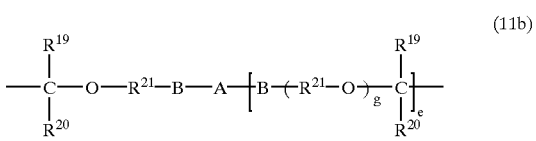 (11b)

In the above formulae (11a) and (11b), each of $R^{19}$ and $R^{20}$ is hydrogen or a straight, branched or cyclic alkyl group of 1 to 8 carbon atoms, or $R^{19}$ and $R^{20}$, taken together, may form a ring, and each of $R^{19}$ and $R^{20}$ is a straight or branched alkylene group of 1 to 8 carbon atoms when they form a ring, $R^{21}$ is a straight, branched or cyclic alkylene group of 1 to 10 carbon atoms, letter e is an integer of 1 to 7, each of letters f and g is 0 or an integer of 1 to 10, A is an (e+1)-valent aliphatic or alicyclic saturated hydrocarbon group, aromatic hydrocarbon group or heterocyclic group of 1 to 50 carbon atoms, which may be separated by a hetero atom and in which some of the hydrogen atoms attached to carbon atoms may be replaced by hydroxyl, carboxyl, carbonyl or halogen, B is —CO—O—, —NHCO—O— or —NHCONH—.

Examples of the acetal crosslinking groups represented by the above formulae (11a) and (11b) include those represented by the following formulae (12)-1 to (12)-8.

 (12)-1

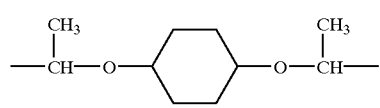 (12)-2

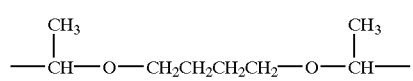 (12)-3

 (12)-4

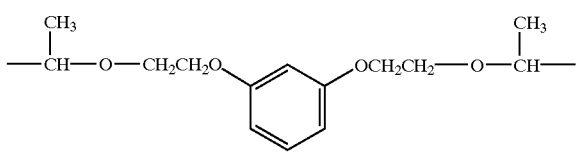
(12)-5

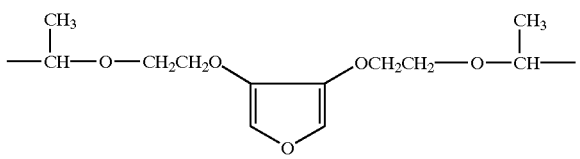
(12)-6

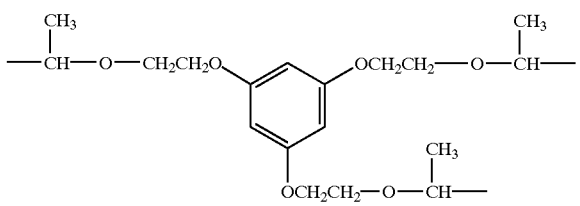
(12)-7

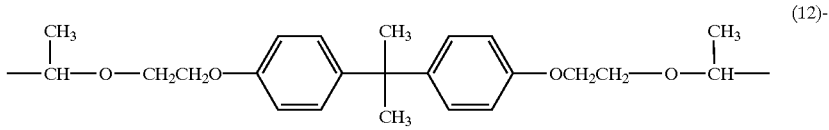
(12)-8

Referring back to formula (2), letters o, p, q, r, s, and t are numbers satisfying $0 \leq o < 5$, $0 < p \leq 5$, $0 \leq q < 5$, $0 \leq r \leq 5$, $0 \leq s \leq 5$, $0 \leq t \leq 5$, and $0 < o+p < 5$, $0 \leq o+q < 5$, and $0 \leq s+t \leq 5$. Letters k, m and n are numbers satisfying $0 < k < 1$, $0 \leq m < 1$, $0 \leq n < 1$. Preferably, k is in the range of $0.1 \leq k \leq 0.9$, especially $0.2 \leq k \leq 0.8$; n is in the range of $0.1 \leq n \leq 0.9$, especially $0.25 \leq n \leq 0.8$; and $0.3 \leq k+n \leq 1$, especially $0.4 \leq k+n \leq 1$.

The polymer of the invention preferably has a weight average molecular weight of about 1,000 to 1,000,000, and especially about 2,000 to 100,000.

In preparing the polymer of the invention, there may be used a monomer of the following formula (1a):

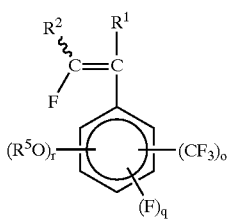
(1a)

wherein the wavy line indicates either cis or trans conformation (throughout the specification), $R^1$, $R^2$, o, q and r are as defined above, $R^5$ is a phenol protective group.

Examples of the protective group represented by $R^5$ include methyl, vinyl, allyl, benzyl, and groups of the following general formulae (i), (ii), (iii), (iv), and (v).

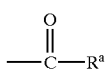
(i)

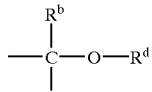
(ii)

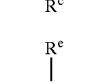
(iii)

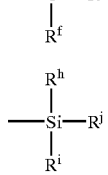
(iv)

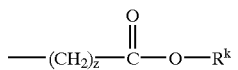
(v)

In the formulae, $R^a$ is a straight, branched or cyclic alkyl group of 1 to 20 carbon atoms. Each of $R^b$ and $R^c$ is hydrogen or a straight, branched or cyclic alkyl group of 1 to 20 carbon atoms which may contain a hetero atom. $R^d$ is a straight, branched or cyclic alkyl group of 1 to 20 carbon atoms which may contain a hetero atom, aryl, aralkyl or oxoalkyl group. A pair of $R^b$ and $R^c$, a pair of $R^b$ and $R^d$, or a pair of $R^c$ and $R^d$, taken together, may form a cyclic structure of 3 to 12 carbon atoms. Each of $R^e$, $R^f$ and $R^g$ is a straight, branched or cyclic alkyl group of 1 to 20 carbon atoms which may contain a hetero atom, aryl, aralkyl or oxoalkyl group. A pair of $R^e$ and $R^f$, a pair of $R^e$ and $R^g$, or a pair of $R^f$ and $R^g$, taken together, may form a cyclic structure of 3 to 12 carbon atoms. Each of $R^h$, $R^i$ and $R^j$ is a straight or branched alkyl group of 1 to 4 carbon atoms. $R^k$ is a straight, branched or cyclic alkyl group of 1 to 20 carbon atoms which may contain a hetero atom, aryl, aralkyl or oxoalkyl group. Letter z is an integer of 0 to 10.

The monomer (styrene derivative) is generally prepared by cross coupling a benzene derivative of the following general formula (vi) with a vinyl derivative of the following general formula (vii).

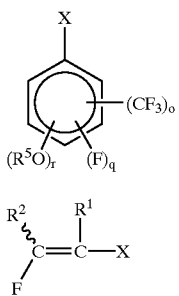

(vi)

(vii)

Herein, $R^1$, $R^2$, $R^5$, o, q, and r are as defined above, and X is a halogen atom, i.e., fluorine, chlorine, bromine or iodine, and especially bromo or iodo.

In effecting the cross coupling, organometallic compounds are prepared from the compounds of formula (vi) or (vii), examples of the organometallic compounds including organic lithium compounds, organic magnesium compounds, organic zinc compound, organic copper compounds, organic titanium compounds, organic tin compounds and organic boron compounds. Transition metal catalysts such as palladium, nickel and copper catalysts must be used in the cross coupling. Exemplary palladium catalysts include zero-valent palladium compounds such as tetrakis(triphenylphosphine)-palladium(0) and di(1,2-bis (diphenylphosphino)-ethane)palladium(0), divalent palladium compounds such as palladium acetate, palladium chloride, and [1,1'-bis-(diphenylphosphino)ferrocene] palladium(II) chloride, complexes of the divalent palladium compounds with ligands, and combinations of the divalent palladium compounds with reducing agents.

Exemplary nickel catalysts include divalent nickel compounds such as (1,3-bis(diphenylphosphino)propane)nickel chloride (II), (1,2-bis(diphenylphosphino)ethane)nickel chloride (II), and bis(triphenylphosphine)nickel chloride (II), and zero-valent nickel compounds such as tetrakis-(triphenylphosphine)nickel(0).

Exemplary copper catalysts include monovalent copper salts such as copper (I) chloride, copper (I) bromide, copper (I) iodide, and copper (I) cyanide, divalent copper salts such as copper (II) chloride, copper (II) bromide, copper (II) iodide, copper (II) cyanide, and copper (II) acetate, and copper complexes such as dilithium tetracuprate.

Using the above-mentioned monomer and optionally another monomer, a polymer or high molecular weight compound is prepared. The polymer is generally prepared by mixing the monomer with a solvent, adding a catalyst thereto, and effecting polymerization reaction while heating or cooling the system if necessary. The polymerization reaction depends on the type of initiator or catalyst, trigger means (including light, heat, radiation and plasma), and polymerization conditions (including temperature, pressure, concentration, solvent, and additives). Commonly used for the polymerization of the monomer are radical polymerization of triggering polymerization with radicals of α,α'-azobisisobutyronitrile (AIBN) or the like, and ion (anion) polymerization using catalysts such as alkyl lithium. Such polymerization may be effected in a conventional manner.

After the monomer of formula (1a) is polymerized, the protective group represented by $R^5$ can be eliminated from the polymer, yielding polymeric units of the following formula.

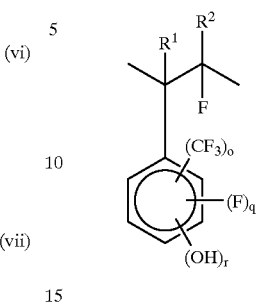

(1b)

In these polymer units as well as the polymer units obtained from the monomer of formula (1b) and represented by the following formula:

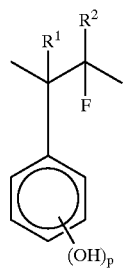

acid labile groups of $R^4$ can be introduced into the phenolic hydroxyl groups in a conventional manner.

The polymer of the invention is useful in resist compositions, and especially chemical amplification type resist compositions.

Resist Composition

A first embodiment of the invention is a photoresist composition comprising the polymer of formula (1).

A second embodiment of the invention is a chemical amplification positive resist composition comprising (A) the polymer defined above, (B) an organic solvent, and (C) a photoacid generator.

A third embodiment of the invention is a chemical amplification negative resist composition comprising (A) the polymer defined above, (B) an organic solvent, (C) a photoacid generator, and (D) a crosslinker.

In any of these embodiment, the resist composition may further contain (E) a basic compound or (F) a dissolution inhibitor or both.

Component (B)

The organic solvent used as component (B) in the invention may be any organic solvent in which the photoacid generator, base resin (inventive polymer), dissolution inhibitor, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol monotert-butyl ether acetate. These solvents may be used alone or in combinations of two or more thereof. Of the above organic solvents, preferred are diethylene glycol dimethyl ether, 1-ethoxy-2-propanol and ethyl lactate, in which the photoacid generator is most soluble, and propylene glycol monomethyl ether acetate which is safe, and mixtures thereof.

The organic solvent is typically used in an amount of about 200 to 5,000 parts, and especially about 400 to 3,000 parts by weight per 100 parts by weight of the base resin.

Component (C)

Suitable examples of the photoacid generator serving as component (C) include onium salts of general formula (6) below, diazomethane derivatives of formula (7), glyoxime derivatives of formula (8), β-ketosulfone derivatives, disulfone derivatives, nitrobenzylsulfonate derivatives, sulfonic acid ester derivatives, and imidoyl sulfonate derivatives.

(6)

In the formula, $R^{30}$ is a straight, branched or cyclic alkyl of 1 to 12 carbon atoms, an aryl of 6 to 12 carbon atoms, or an aralkyl of 7 to 12 carbon atoms; $M^+$ is iodonium or sulfonium; $K^-$ is a non-nucleophilic counter-ion; and the letter b is 2 or 3.

Illustrative examples of alkyl groups represented by $R^{30}$ include methyl, ethyl, propyl, butyl, cyclohexyl, 2-oxocyclohexyl, norbornyl, and adamantyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary aralkyl groups include benzyl and phenethyl. Examples of the non-nucleophilic counter-ion represented by $K^-$ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

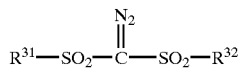

(7)

In the formula, $R^{31}$ and $R^{32}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms.

Illustrative examples of alkyl groups represented by $R^{31}$ and $R^{32}$ include methyl, ethyl, propyl, butyl, amyl, cyclopentyl, cyclohexyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorobenzene, chlorobenzene, and 1,2,3,4,5-pentafluorobenzene. Exemplary aralkyl groups include benzyl and phenethyl.

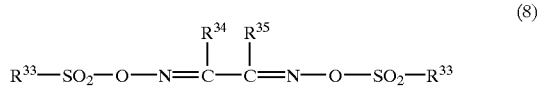

(8)

In the formula, $R^{33}$, $R^{34}$, and $R^{35}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms. $R^{34}$ and $R^{35}$ may together form a cyclic structure with the proviso that if they form a cyclic structure, each is a straight or branched alkylene group of 1 to 6 carbon atoms.

The alkyl, halogenated alkyl, aryl, halogenated aryl, and aralkyl groups represented by $R^{33}$, $R^{34}$, and $R^{35}$ are exemplified by the same groups as mentioned above for $R^{31}$ and $R^{32}$. Examples of alkylene groups represented by $R^{34}$ and $R^{35}$ include methylene, ethylene, propylene, butylene, and hexylene.

Illustrative examples of the photoacid generator include:
onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)-sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, and dicyclohexylphenylsulfonium p-toluenesulfonate;

diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-a-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl- 3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexanesulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimrthylglyoxime, bis-o-(xylenesulfonyl)-α-dimethylglyoxime, and bis-o-(camphorsulfonyl)-α-dimethylglyoxime;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butylsulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, and tris(p-tert-butoxyphenyl)sulfonium p-toluenesulfonate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane; and glyoxime derivatives such as bis-o-(p-toluenesulfonyl)-α-dimethylglyoxime and bis-o-(n-butanesulfonyl)-α-dimethylglyoxime. These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is preferably added in an amount of about 0.2 to 15 parts by weight, and especially about 0.5 to 8 parts by weight, per 100 parts by weight of all the base resins. At less than 0.2 part, the amount of acid generated during exposure would be too small and the sensitivity and resolution are poor, whereas the addition of more than 15 parts would lower the transmittance of the resist and results in a poor resolution.

Component (E)

The basic compound used as component (E) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile. See JP-A 5-232706, 5-249683, 5-158239, 5-249662, 5-257282, 5-289322, and 5-289340.

Examples of suitable basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives. Of these, aliphatic amines are especially preferred.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)-pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formulas (9) and (10) may also be included.

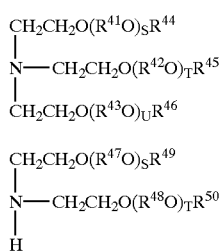

In the formulas, $R^{41}$, $R^{42}$, $R^{43}$, $R^{47}$ and $R^{48}$ are independently straight, branched or cyclic alkylenes of 1 to 20 carbon atoms; $R^{44}$, $R^{45}$, $R^{46}$, $R^{49}$ and $R^{50}$ are hydrogen, alkyls of 1 to 20 carbon atoms, or amino; $R^{44}$ and $R^{45}$, $R^{45}$ and $R^{46}$, $R^{44}$ and $R^{46}$, $R^{44}$ with $R^{45}$ and $R^{46}$, and $R^{49}$ and $R^{50}$ may bond together to form rings; and S, T and U are each integers from 0 to 20, with the proviso that hydrogen is excluded from $R^{44}$, $R^{45}$, $R^{46}$, $R^{49}$ and $R^{50}$ when S, T and U are equal to 0.

The alkylene groups represented by $R^{41}$, $R^{42}$, $R^{43}$, $R^{47}$ and $R^{48}$ preferably have 1 to 20 carbon atoms, more preferably 1 to 10 carbon atoms, and most preferably 1 to 8 carbon atoms. Examples include methylene, ethylene, n-propylene, n-butylene, isobutylene, n-pentylene, isopentylene, hexylene, nonylene, decylene, cyclopentylene, and cyclohexylene.

The alkyl groups represented by $R^{44}$, $R^{45}$, $R^{46}$, $R^{49}$ and $R^{50}$ preferably have 1 to 20 carbon atoms, more preferably 1 to 8 carbon atoms, and most preferably 1 to 6 carbon atoms, and may be straight, branched or cyclic. Examples include methyl, ethyl, n-propyl, isopropyl, n-butyl, isobutyl, tert-butyl, n-pentyl, isopentyl, hexyl, nonyl, decyl, dodecyl, tridecyl, cyclopentyl, and cyclohexyl.

Where $R^{44}$ and $R^{45}$, $R^{45}$ and $R^{46}$, $R^{44}$ and $R^{46}$ $R^{44}$ with $R^{45}$ and $R^{46}$, and $R^{49}$ and $R^{50}$ form rings, the rings preferably have 1 to 20 carbon atoms, more preferably 1 to 8 carbon atoms, and most preferably 1 to 6 carbon atoms, and may have branching alkyl groups of 1 to 6 carbon atoms, and especially 1 to 4 carbon atoms.

S, T, and U are each integers from 0 to 20, preferably from 1 to 10, and more preferably from 1 to 8.

Illustrative examples of the compounds of formulas (9) and (10) include tris{2-(methoxymethoxy)ethyl}amine, tris{2-(methoxyethoxy)ethyl}amine, tris[2-{(2-methoxyethoxy)methoxy}ethyl]amine, tris{2-(2-methoxyethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, and 1-aza-18-crown-6. Especially preferred basic compounds are tertiary amines, aniline derivatives, pyrrolidine derivatives, pyridine derivatives, quinoline derivatives, amino acid derivatives, hydroxyl group-bearing nitrogenous compounds, hydroxyphenyl group-bearing nitrogenous compounds, alcoholic nitrogenous compounds, amide derivatives, imide derivatives, tris{2-(methoxymethoxy)ethyl}amine, tris{2-(2-methoxyethoxy)ethyl}amine, tris[2-{(2-methoxyethoxy)methyl}ethyl]amine, and 1-aza-15-crown-5.

The above-described basic compound may be used singly or in combinations of two or more thereof, and is preferably formulated in an amount of about 0.01 to 2 parts, and especially about 0.01 to 1 part by weight, per 100 parts by weight of all the base resins. At less than 0.01 part, the desired effects of the basic compound would not be apparent, while the use of more than 2 parts would result in too low a sensitivity.

Component (F)

The dissolution inhibitor (F) is a compound with a molecular weight of up to 3,000 which changes its solubility in an alkaline developer under the action of an acid. Typically, a compound obtained by partially or entirely substituting acid labile substituents on a phenol or carboxylic acid derivative having a molecular weight of up to 2,500 is added as the dissolution inhibitor.

Examples of the phenol or carboxylic acid derivative having a molecular weight of up to 2,500 include bisphenol A, bisphenol H, bisphenol S, 4,4-bis(4'-hydroxyphenyl) valeric acid, tris(4-hydroxyphenyl)methane, 1,1,1-tris(4'-hydroxyphenyl)ethane, 1,1,2-tris(4'-hydroxyphenyl)ethane, phenolphthalein, and thimolphthalein. The acid labile substituents are the same as $R^2$.

Illustrative, non-limiting, examples of the dissolution inhibitors which are useful herein include bis(4-(2'-tetrahydropyranyloxy)phenyl)methane,
bis(4-(2'-tetrahydrofuranyloxy)phenyl)methane,
bis(4-tert-butoxyphenyl)methane,
bis(4-tert-butoxycarbonyloxyphenyl)methane,
bis(4-tert-butoxycarbonylmethyloxyphenyl)methane,
bis(4-(1'-ethoxyethoxy)phenyl)methane,
bis(4-(1'-ethoxypropyloxy)phenyl)methane, 2,2-bis(4'-(2"-tetrahydropyranyloxy))propane,
2,2-bis(4'-(2"-tetrahydrofuranyloxy)phenyl)propane,
2,2-bis(4'-tert-butoxyphenyl)propane,
2,2-bis(4'-tert-butoxycarbonyloxyphenyl)propane,
2,2-bis(4-tert-butoxycarbonylmethyloxyphenyl)propane,
2,2-bis(4'-(1"-ethoxyethoxy)phenyl)propane,
2,2-bis(4'-(1"-ethoxypropyloxy)phenyl)propane,
tert-butyl 4,4-bis(4'-(2"-tetrahydropyranyloxy)phenyl) valerate,
tert-butyl 4,4-bis(4'-(2"-tetrahydrofuranyloxy)phenyl) valerate,
tert-butyl 4,4-bis(4'-tert-butoxyphenyl)valerate,
tert-butyl 4,4-bis(4-tert-butoxycarbonyloxyphenyl)valerate,
tert-butyl 4,4-bis(4'-tert-butoxycarbonylmethyloxyphenyl) valerate,
tert-butyl 4,4-bis(4'-(1"-ethoxyethoxy)phenyl)valerate,
tert-butyl 4,4-bis(4'-(1"-ethoxypropyloxy)phenyl)valerate,
tris(4-(2'-tetrahydropyranyloxy)phenyl)methane,
tris(4-(2'-tetrahydrofuranyloxy)phenyl)methane,
tris(4-tert-butoxyphenyl)methane,
tris(4-tert-butoxycarbonyloxyphenyl)methane,
tris(4-tert-butoxycarbonyloxymethylphenyl)methane,
tris(4-(1'-ethoxyethoxy)phenyl)methane,
tris(4-(1'-ethoxypropyloxy)phenyl)methane,
1,1,2-tris(4'-(2"-tetrahydropyranyloxy)phenyl)ethane,
1,1,2-tris(4'-(2"-tetrahydrofuranyloxy)phenyl)ethane,
1,1,2-tris(4'-tert-butoxyphenyl)ethane,
1,1,2-tris(4'-tert-butoxycarbonyloxyphenyl)ethane,
1,1,2-tris(4'-tert-butoxycarbonylmethyloxyphenyl)ethane,
1,1,2-tris(4'-(1'-ethoxyethoxy)phenyl)ethane, and
1,1,2-tris(4'-(1'-ethoxypropyloxy)phenyl)ethane.

In the resist composition according to the invention, an appropriate amount of the dissolution inhibitor (F) is up to about 20 parts, and especially up to about 15 parts by weight per 100 parts by weight of the solids in the composition. With more than 20 parts of the dissolution inhibitor, the resist composition becomes less heat resistant because of an increased content of monomer components.

Component (D)

Formulated in the negative resist composition is an acid crosslinker which forms a crosslinked structure under the action of acid. Typical crosslinkers are compounds having at least two hydroxymethyl, alkoxymethyl, epoxy or vinyl ether groups within a molecule. Substituted glycoluril derivatives, urea derivatives, and hexa(methoxymethyl) melamine compounds are suitable as the acid crosslinker in the chemically amplified, negative resist composition. Examples include N,N,N',N'-tetramethoxymethylurea, hexamethoxymethylmelamine, tetraalkoxymethyl-substituted glycoluril compounds such as tetrahydroxymethyl-substituted glycoluril and tetramethoxymethylglycoluril, and condensates of phenolic compounds such as substituted or unsubstituted bis(hydroxymethylphenol) compounds and bisphenol A with epichlorohydrin. Especially preferred crosslinkers are 1,3,5,7-tetraalkoxymethylglycolurils such as 1,3,5,7-tetramethoxymethylglycoluril, 1,3,5,7-tetrahydroxymethylglycoluril, 2,6-dihydroxymethyl-p-cresol, 2,6-dihydroxymethylphenol, 2,2',6,6'-tetrahydroxymethylbisphenol A, 1,4-bis[2-(2-hydroxypropyl)]benzene, N,N,N',N'-tetramethoxymethylurea, and hexamethoxymethylmelamine. In the resist composition, an appropriate amount of the crosslinker is about 1 to 25 parts, and especially about 5 to 15 parts by weight per 100 parts by weight of the solids in the composition. The crosslinkers may be used alone or in admixture of two or more.

The resist composition of the invention may include, as an optional ingredient, a surfactant which is commonly used for improving the coating characteristics. Optional ingredients may be added in conventional amounts so long as this does not compromise the objects of the invention.

A nonionic surfactant is preferred, examples of which include perfluoroalkyl polyoxyethylene ethanols, fluorinated alkyl esters, perfluoroalkylamine oxides, and fluorinated organosiloxane compounds. Illustrative examples include Florade FC-430 and FC-431 from Sumitomo 3M Ltd., Surflon S-141, S-145, S-381 and S-383 from Asahi Glass Co., Ltd., Unidyne DS-401, DS-403, and DS-451 from Daikin Industries Ltd., Megaface F-8151, F-171, F-172, F-173 and F-177 from Dainippon Ink & Chemicals, Inc., and X-70-092 and X-70-093 from Shin-Etsu Chemical Co., Ltd. Preferred surfactants include Florade FC-430 from Sumitomo 3M Ltd. and X-70-093 from Shin-Etsu Chemical Co., Ltd.

Pattern formation using the chemical amplification resist composition of the invention may be carried out by a known lithographic technique. For example, the resist composition may be applied onto a substrate such as a silicon wafer by spin coating or the like to form a resist film having a thickness of 0.1 to 1.0 μm, which is then pre-baked on a hot plate at 60 to 200° C. for 10 seconds to 10 minutes, and preferably at 80 to 150° C. for ½ to 5 minutes. A patterning mask having the desired pattern may then be placed over the resist film, and the film exposed through the mask to an electron beam or to high-energy radiation such as deep-UV rays having a wavelength below 300 nm, an excimer laser, or x-rays in a dose of about 1 to 200 mJ/cm$^2$, and preferably about 10 to 100 mJ/cm$^2$, then post-exposure baked (PEB) on a hot plate at 60 to 150° C. for 10 seconds to 5 minutes, and preferably at 80 to 130° C. for ½ to 3 minutes. Finally, development may be carried out using as the developer an aqueous alkali solution, such as 0.1 to 5%, and preferably 2 to 3%, tetramethylammonium hydroxide (TMAH), this being done by a conventional method such as dipping, puddling, or spraying for a period of 10 seconds to 3 minutes, and preferably 30 seconds to 2 minutes. These steps result in the formation of the desired pattern on the substrate. Of the various types of high-energy radiation that may be used, the resist composition of the invention is best suited to fine pattern formation with, in particular, deep-UV rays having a wavelength of 120 to 254 nm, an excimer laser, especially ArF excimer laser (193 nm), $F_2$ excimer laser (157 nm), $Kr_2$ excimer laser (146 nm), KrAr excimer laser (134 nm) or $Ar_2$ excimer laser (126 nm), x-rays, or an electron beam. The desired pattern may not be obtainable outside the upper and lower limits of the above range.

The resist composition comprising the polymer of the invention is sensitive to high-energy radiation, has excellent sensitivity and resolution at a wavelength of up to 200 nm, especially up to 170 nm, and excellent plasma etching resistance. Because these features of the inventive resist composition enable its use particularly as a resist having a low absorption at the exposure wavelength of a $F_2$ excimer laser, a finely defined pattern having sidewalls perpendicular to the substrate can easily be formed, making the resist ideal as a micropatterning material in VLSI fabrication.

EXAMPLE

Examples of the invention are given below by way of illustration and not by way of limitation. AIBN denotes α,α'-azobisisobutyronitrile, and THF denotes tetrahydrofuran.

Reference Synthesis Example 1
Synthesis of 4-tert-butoxy-2,3-difluoro-α,β,β-trifluorostyrene A 1-liter reactor was charged with 31.2 g (0.10 mol) of 4-tert-butoxy-2,3-difluoro-1-iodobenzene and 100 ml of THF and heated at 60° C. To the reactor, 1.16 g (1 mmol) of tetrakis(triphenylphosphine)palladium(0) was added, then 300 ml of a THF solution of 1 M trifluorovinyl zinc iodide was added dropwise. After the completion of dropwise addition, the reaction solution was ripened for 30 minutes and poured into a saturated ammonium chloride aqueous solution. From the solution, a crude product was extracted with ethyl acetate in a conventional way. It was purified by silica gel chromatography, obtaining 21.5 g (yield 81%) the end product (Monomer 1).

IR (ν): 2981, 1776, 1624, 1504, 1477, 1369, 1311, 1159, 1070, 1024, 883, 858 (cm$^{-1}$)

| $^1$H-NMR: | 1.40 ppm (9H, s) |
| | 6.85–6.95 ppm (1H, m) |
| | 7.03–7.12 ppm (1H, m) |

Reference Synthesis Example 2

Synthesis of 4-tert-butoxy-2,6-difluoro-α,β,β-trifluorostyrene

The end product (Monomer 2) was obtained as in Reference Synthesis Example 1 except that 4-tert-butoxy-2,6-difluoro-1-iodobenzene was used instead of the 4-tert-butoxy-2,3-difluoro-1-iodobenzene.

Reference Synthesis Example 3

Synthesis of 4-tert-butoxy-3,5-difluoro-α,β,β-trifluorostyrene

The end product (Monomer 3) was obtained as in Reference Synthesis Example 1 except that 4-tert-butoxy-3,5-difluoro-1-iodobenzene was used instead of the 4-tert-butoxy-2,3-difluoro-1-iodobenzene.

Reference Synthesis Example 4

Synthesis of 4-tert-butoxy-2,3,5,6-tetrafluoro-α,β,β-trifluorostyrene

The end product (Monomer 4) was obtained as in Reference Synthesis Example 1 except that 4-tert-butoxy-2,3,5,6-tetrafluoro-1-iodobenzene was used instead of the 4-tert-butoxy-2,3-difluoro-1-iodobenzene.

Synthesis Example 1

Synthesis of Polymer 1

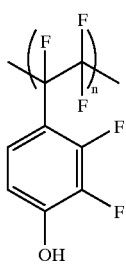

Polymer 1

-continued

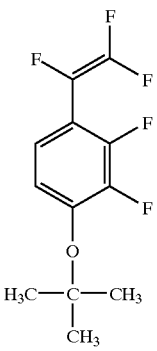

Monomer 1

In a 2-liter flask, 120 g of Monomer 1 was dissolved in 560 ml of toluene. After oxygen was fully purged out of the system, 5.5 g of initiator AIBN was admitted. The flask was heated at 60° C., at which polymerization reaction was effected for 24 hours.

In order to work up the polymer, the reaction mixture was poured into a 3/2 mixture of hexane and ether whereupon the polymer precipitated. The polymer was separated and dried, obtaining 110 g of a white polymer.

The polymer was transferred to a 2-liter flask and dissolved in acetone to form a 15% solution. After the solution was heated at 60° C., 46 ml of 12N hydrochloric acid was slowly added dropwise, and deblocking reaction was effected for 7 hours.

Pyridine, 66 g, was added to the reaction solution, which was concentrated and poured into 5 liters of pure water, whereupon the polymer precipitated. The procedure of dissolving the collected polymer in acetone and pouring into 5 liters of pure water for precipitation was repeated twice. The polymer was separated and dried. There was obtained 81 g of a white polymer. This polymer was found to have a weight average molecular weight (Mw) of 13,000 g/mol as measured by the light scattering method and a dispersity (Mw/Mn) of 1.65 as determined from the GPC elution curve.

Synthesis Example 2

Synthesis of Polymer 2

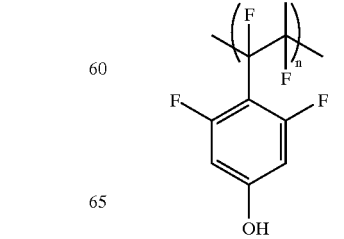

Polymer 2

Monomer 2

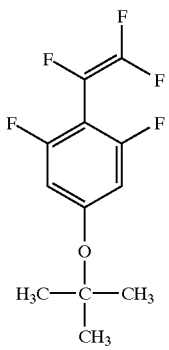

Monomer 3

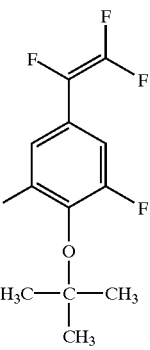

In a 2-liter flask, 120 g of Monomer 2 was dissolved in 560 ml of toluene. After oxygen was fully purged out of the system, 5.5 g of initiator AIBN was admitted. The flask was heated at 60° C., at which polymerization reaction was effected for 24 hours.

In order to work up the polymer, the reaction mixture was poured into a 3/2 mixture of hexane and ether whereupon the polymer precipitated. The polymer was separated and dried, obtaining 110 g of a white polymer.

The polymer was transferred to a 2-liter flask and dissolved in acetone to form a 15% solution. After the solution was heated at 60° C., 46 ml of 12N hydrochloric acid was slowly added dropwise, and deblocking reaction was effected for 7 hours.

Pyridine, 66 g, was added to the reaction solution, which was concentrated and poured into 5 liters of pure water, whereupon the polymer precipitated. The procedure of dissolving the collected polymer in acetone and pouring into 5 liters of pure water for precipitation was repeated twice. The polymer was separated and dried. There was obtained 81 g of a white polymer. This polymer was found to have a weight average molecular weight (Mw) of 12,000 g/mol as measured by the light scattering method and a dispersity (Mw/Mn) of 1.55 as determined from the GPC elution curve.

In a 2-liter flask, 120 g of Monomer 3 was dissolved in 560 ml of toluene. After oxygen was fully purged out of the system, 5.5 g of initiator AIBN was admitted. The flask was heated at 60° C., at which polymerization reaction was effected for 24 hours.

In order to work up the polymer, the reaction mixture was poured into a 3/2 mixture of hexane and ether whereupon the polymer precipitated. The polymer was separated and dried, obtaining 110 g of a white polymer.

The polymer was transferred to a 2-liter flask and dissolved in acetone to form a 15% solution. After the solution was heated at 60° C., 46 ml of 12N hydrochloric acid was slowly added dropwise, and deblocking reaction was effected for 7 hours.

Pyridine, 66 g, was added to the reaction solution, which was concentrated and poured into 5 liters of pure water, whereupon the polymer precipitated. The procedure of dissolving the collected polymer in acetone and pouring into 5 liters of pure water for precipitation was repeated twice. The polymer was separated and dried. There was obtained 81 g of a white polymer. This polymer was found to have a weight average molecular weight (Mw) of 14,000 g/mol as measured by the light scattering method and a dispersity (Mw/Mn) of 1.75 as determined from the GPC elution curve.

Synthesis Example 3

Synthesis of Polymer 3

Polymer 3

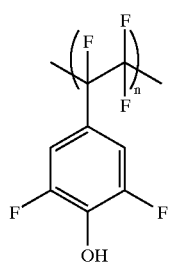

Synthesis Example 4

Synthesis of Polymer 4

Polymer 4

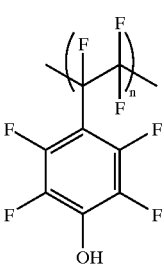

-continued

Monomer 4

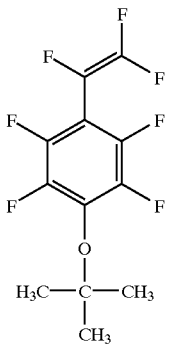

In a 2-liter flask, 120 g of Monomer 4 was dissolved in 560 ml of toluene. After oxygen was fully purged out of the system, 5.5 g of initiator AIBN was admitted. The flask was heated at 60° C., at which polymerization reaction was effected for 24 hours.

In order to work up the polymer, the reaction mixture was poured into a 3/2 mixture of hexane and ether whereupon the polymer precipitated. The polymer was separated and dried, obtaining 110 g of a white polymer.

The polymer was transferred to a 2-liter flask and dissolved in acetone to form a 15% solution. After the solution was heated at 60° C., 46 ml of 12N hydrochloric acid was slowly added dropwise, and deblocking reaction was effected for 7 hours.

Pyridine, 66 g, was added to the reaction solution, which was concentrated and poured into 5 liters of pure water, whereupon the polymer precipitated. The procedure of dissolving the collected polymer in acetone and pouring into 5 liters of pure water for precipitation was repeated twice. The polymer was separated and dried. There was obtained 81 g of a white polymer. This polymer was found to have a weight average molecular weight (Mw) of 9,000 g/mol as measured by the light scattering method and a dispersity (Mw/Mn) of 1.55 as determined from the GPC elution curve.

Synthesis Example 5

Ethoxyethylation of Polymer 1

A 300-ml flask was charged with 20 g of Polymer 1 obtained in Synthesis Example 1, 0.6 g of trifluoromethane-sulfonic acid and 100 ml of THF. With stirring at room temperature, 0.60 g of ethyl vinyl ether was added dropwise from a dropping funnel. The reaction mixture was ripened at room temperature for one hour.

Triethylamine was added to the reaction system to terminate reaction, and the solvent was distilled off under vacuum. The resulting crude polymer was dissolved in 40 g of acetone, which was poured into 5 liters of pure water with 20 g of acetic acid dissolved therein, whereupon the polymer precipitated. The procedure of dissolving the polymer in 40 g of acetone and pouring it into 5 liters of pure water for precipitation was repeated twice, following which the polymer was separated and dried. There was obtained 15.5 g of a white polymer, which was analyzed by proton-NMR to find that 20% of the hydroxyl groups on the 4-hydroxystyrene units were converted into ethoxyethyl. This polymer was found to have a weight average molecular weight (Mw) of 14,000 g/mol as measured by the light scattering method and a dispersity (Mw/Mn) of 1.65 as determined from the GPC elution curve.

Synthesis Example 6

Ethoxyethylation of Polymer 2

A 300-ml flask was charged with 20 g of Polymer 2 obtained in Synthesis Example 2, 0.6 g of trifluoromethane-sulfonic acid and 100 ml of THF. With stirring at room temperature, 0.60 g of ethyl vinyl ether was added dropwise from a dropping funnel. The reaction mixture was ripened at room temperature for one hour.

Triethylamine was added to the reaction system to terminate reaction, and the solvent was distilled off under vacuum. The resulting crude polymer was dissolved in 40 g of acetone, which was poured into 5 liters of pure water with 20 g of acetic acid dissolved therein, whereupon the polymer precipitated. The procedure of dissolving the polymer in 40 g of acetone and pouring it into 5 liters of pure water for precipitation was repeated twice, following which the polymer was separated and dried. There was obtained 15.5 g of a white polymer, which was analyzed by proton-NMR to find that 22% of the hydroxyl groups on the 4-hydroxystyrene units were converted into ethoxyethyl. This polymer was found to have a weight average molecular weight (Mw) of 13,000 g/mol as measured by the light scattering method and a dispersity (Mw/Mn) of 1.55 as determined from the GPC elution curve.

Synthesis Example 7

Ethoxyethylation of Polymer 3

A 300-ml flask was charged with 20 g of Polymer 3 obtained in Synthesis Example 3, 0.6 g of trifluoromethane-sulfonic acid and 100 ml of THF. With stirring at room temperature, 0.60 g of ethyl vinyl ether was added dropwise from a dropping funnel. The reaction mixture was ripened at room temperature for one hour.

Triethylamine was added to the reaction system to terminate reaction, and the solvent was distilled off under vacuum. The resulting crude polymer was dissolved in 40 g of acetone, which was poured into 5 liters of pure water with 20 g of acetic acid dissolved therein, whereupon the polymer precipitated. The procedure of dissolving the polymer in 40 g of acetone and pouring it into 5 liters of pure water for precipitation was repeated twice, following which the polymer was separated and dried. There was obtained 15.5 g of a white polymer, which was analyzed by proton-NMR to find that 18% of the hydroxyl groups on the 4-hydroxystyrene units were converted into ethoxyethyl. This polymer was found to have a weight average molecular weight (Mw) of 15,000 g/mol as measured by the light scattering method and a dispersity (Mw/Mn) of 1.77 as determined from the GPC elution curve.

Synthesis Example 8

Ethoxyethylation of Polymer 4

A 300-ml flask was charged with 20 g of Polymer 4 obtained in Synthesis Example 4, 0.6 g of trifluoromethane-sulfonic acid and 100 ml of THF. With stirring at room temperature, 0.60 g of ethyl vinyl ether was added dropwise from a dropping funnel. The reaction mixture was ripened at room temperature for one hour.

Triethylamine was added to the reaction system to terminate reaction, and the solvent was distilled off under vacuum. The resulting crude polymer was dissolved in 40 g of acetone, which was poured into 5 liters of pure water with 20 g of acetic acid dissolved therein, whereupon the polymer precipitated. The procedure of dissolving the polymer in 40 g of acetone and pouring it into 5 liters of pure water for precipitation was repeated twice, following which the polymer was separated and dried. There was obtained 15.5 g of a white polymer, which was analyzed by proton-NMR to find that 12% of the hydroxyl groups on the 4-hydroxystyrene units were converted into ethoxyethyl. This polymer was found to have a weight average molecular weight (Mw) of 9,500 g/mol as measured by the light scattering method and a dispersity (Mw/Mn) of 1.55 as determined from the GPC elution curve.

Comparative Polymers

A polymer, designated Comparative Polymer 1, was synthesized from a monodisperse polyhydroxystyrene having a molecular weight of 10,000 and a dispersity (Mw/Mn) of 1.10 by substituting tetrahydropyranyl groups for 30% of the hydroxyl groups. Comparative Polymer 2 was poly(methyl methacrylate) having a molecular weight of 15,000 and a dispersity of 1.7. Comparative Polymer 3 was a novolac polymer having a meta/para ratio of 40/60, a molecular weight of 9,000 and a dispersity of 2.5.

Next, each of the polymers of Synthesis Examples (SE) 5 to 8 and Comparative Polymers 1 to 3, 1 g, was thoroughly dissolved in 10 g of propylene glycol monomethyl ether acetate, and passed through a 0.2-m filter, obtaining a polymer solution.

The polymer solution was spin coated onto a $MgF_2$ substrate and baked on a hot plate at 100° C. for 90 seconds, forming a polymer layer of 300 nm thick on the $MgF_2$ substrate. Using a vacuum ultraviolet spectrometer (VUV200S by Nihon Bunko K.K.), the polymer layer was measured for transmittance at 248 nm, 193 nm and 157 nm. The results are shown in Table 1.

TABLE 1

| Polymer | Transmittance (%) at 248 nm | Transmittance (%) at 193 nm | Transmittance (%) at 157 nm |
|---|---|---|---|
| Polymer of SE5 | 88 | 11 | 28 |
| Polymer of SE6 | 87 | 10 | 27 |
| Polymer of SE7 | 89 | 12 | 33 |
| Polymer of SE8 | 87 | 14 | 40 |
| Comparative Polymer 1 | 85 | 1 | 3 |
| Comparative Polymer 2 | 90 | 70 | 1 |
| Comparative Polymer 3 | 70 | 1 | 6 |

Examples and Comparative Examples

Resist solutions were prepared in a conventional manner by formulating the polymer, photoacid generator, basic compound, dissolution inhibitor and solvent in the amounts shown in Table 2.

On silicon wafers, DUV-30 (Nissan Chemical K.K.) was coated to form films of 55 nm thick so that the reflectance to KrF light (248 nm) was reduced below 1%. On the coated substrates, the resist solutions were spin coated, then baked at 100° C. for 90 seconds on a hot plate to give resist films having a thickness of 300 nm.

The resist films were exposed by means of an excimer laser stepper (NSR-S202A, from Nikon Corporation; NA 0.5, σ 0.75, 2/3 zone illumination). Immediately after exposure, the resist films were baked at 110° C. for 90 seconds and then developed for 60 seconds with a 2.38% aqueous solution of tetramethylammonium hydroxide, thereby giving positive patterns.

The resulting resist patterns were evaluated as described below. The results are shown in Tables 2 and 3.

Evaluation:

Provided that the exposure dose which provides a 1:1 resolution at the top and bottom of a 0.25-$\mu$m line-and-space pattern was the optimum exposure dose (sensitivity Eop), the minimum line width of a line-and-space pattern which was ascertained separate at this dose was the resolution of a test resist.

Dry etching tests were carried out on the spin-coated resist films by etching them under two sets of conditions.

(1) Etching test with $CHF_3/CF_4$ gas

Using a dry etching instrument TE-8500P (Tokyo Electron K.K.), the difference in resist film thickness before and after etching was determined.

The etching conditions are given below.

| | |
|---|---|
| chamber pressure | 40.0 Pa |
| RF power | 1300 W |
| gap | 9 mm |
| $CHF_3$ gas flow rate | 0.03 L/min |
| $CF_4$ gas flow rate | 0.03 L/min |
| Ar gas flow rate | 0.10 L/min |
| time | 60 sec |

(2) Etching test with $Cl_2/BCl_3$ gas

Using a dry etching instrument L-507D-L (Nichiden Anerba K.K.), the difference in resist film thickness before and after etching was determined.

The etching conditions are given below.

| | |
|---|---|
| chamber pressure | 46.0 Pa |
| RF power | 300 W |
| gap | 9 mm |
| $Cl_2$ gas flow rate | 0.03 L/min |
| $BCl_3$ gas flow rate | 0.03 L/min |
| $CHF_3$ gas flow rate | 0.10 L/min |
| $O_2$ gas flow rate | 0.002 L/min |
| time | 360 sec |

The photoacid generators, dissolution inhibitor, basic compound and crosslinker used are shown below.

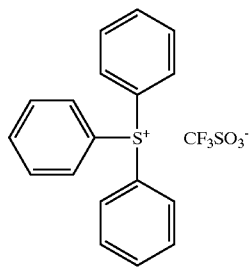

PAG 1

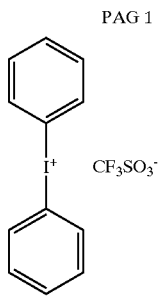

PAG 2

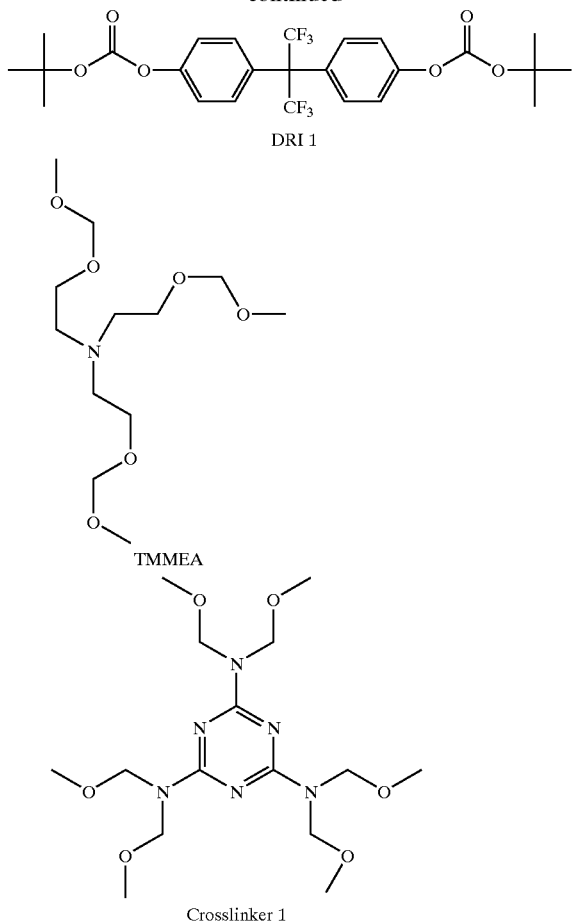

DRI 1

TMMEA

Crosslinker 1

TBA: tributylamine
TEA: triethanolamine
TMMEA: trismethoxymethoxyethylamine (as above)

TABLE 2

| Polymer (pbw) | Photoacid generator (pbw) | Basic compound (pbw) | Dissolution inhibitor/ crosslinker (pbw) | Sensitivity (mJ/cm$^2$) | Resolution ($\mu$m) |
|---|---|---|---|---|---|
| SE5 (100) | PAG1 (2) | TBA (0.1) | — | 20 | 0.22 |
| SE6 (100) | PAG1 (2) | TBA (0.1) | — | 24 | 0.22 |
| SE7 (100) | PAG1 (2) | TBA (0.1) | — | 23 | 0.24 |
| SE8 (100) | PAG1 (2) | TBA (0.1) | — | 29 | 0.26 |
| SE5 (100) | PAG1 (2) | TBA (0.1) | DRI 1 (20) | 23 | 0.22 |
| SE5 (100) | PAG2 (2) | TBA (0.1) | — | 13 | 0.24 |
| SE5 (100) | PAG1 (2) | TEA (0.1) | — | 25 | 0.22 |
| SE5 (100) | PAG1 (2) | TMMEA (0.2) | — | 25 | 0.22 |
| SE1 (100) | PAG2 (2) | TBA (0.1) | Crosslinker 1 (10) | 30 | 0.24 |
| SE2 (100) | PAG2 (2) | TBA (0.1) | Crosslinker 1 (10) | 30 | 0.24 |
| SE3 (100) | PAG2 (2) | TBA (0.1) | Crosslinker 1 (10) | 30 | 0.24 |
| SE4 (100) | PAG2 (2) | TBA (0.1) | Crosslinker 1 (10) | 40 | 0.24 |

TABLE 3

| Polymer | CHF$_3$/CF$_4$ gas etching rate (nm/min) | Cl$_2$/BCl$_3$ gas etching rate (nm/min) |
|---|---|---|
| SE1 polymer | 95 | 103 |
| SE2 polymer | 92 | 103 |
| SE3 polymer | 93 | 105 |

TABLE 3-continued

| Polymer | CHF$_3$/CF$_4$ gas etching rate (nm/min) | Cl$_2$/BCl$_3$ gas etching rate (nm/min) |
|---|---|---|
| SE4 polymer | 109 | 120 |
| SE5 polymer | 110 | 128 |
| SE6 polymer | 112 | 125 |
| SE7 polymer | 115 | 120 |
| SE8 polymer | 116 | 122 |
| Comparative Polymer 1 | 110 | 210 |
| Comparative Polymer 2 | 180 | 350 |
| Comparative Polymer 3 | 90 | 110 |

As is evident from Tables 1 to 3, resist materials using the polymers of the invention have sufficient transparency in the region of F$_2$ excimer laser (157 nm) and satisfy the resolution and sensitivity requirements. The difference in resist film thickness before and after etching is small, indicating superior dry etching resistance.

Japanese Patent Application No. 11-291558 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A polymer comprising a polystyrene derivative of a fluorinated backbone having recurring units of the following formula (1):

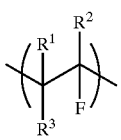

(1)

wherein

R$^1$ is hydrogen, fluorine or an unsubstituted or fluorinated, straight, branched or cyclic alkyl group of 1 to 20 carbon atoms, R$^2$ is fluorine or an unsubstituted or fluorinated, straight, branched or cyclic alkyl group of 1 to 20 carbon atoms, and R$^3$ is an aryl group of 6 to 20 carbon atoms optionally having attached thereto a hydroxyl group or an OR$^4$ group wherein R$^4$ is an acid labile group, or both, provided that at least one R$^3$ has an attached OR$^4$ group wherein the acid labile group represented by R$^4$ is selected from the group consisting of groups of the following formulae (3) and (4), tertiary alkyl groups with 4 to 40 carbon atoms of the following formula (5), trialkylsilyl groups whose alkyl groups each have 1 to 6 carbon atoms, and oxoalkyl groups of 4 to 20 carbon atoms,

(3)

-continued

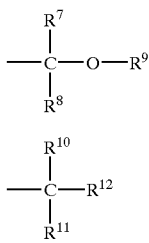

wherein,
R⁶ is a tertiary alkyl group of 4 to 20 carbon atoms, a trialkylsilyl group whose alkyl groups each have 1 to 6 carbon atoms, an oxoalkyl group of 4 to 20 carbon atoms or a group of formula (5),
letter a is an integer of 0 to 6,
R⁷ and R⁸ are independently hydrogen or straight, branched or cyclic alkyl groups of 1 to 18 carbon atoms,
R⁹ is a monovalent hydrocarbon group of 1 to 18 carbon atoms, which optionally has a hetero atom, or a pair of R⁷ and R⁸, a pair of R⁷ and R⁹, or a pair of R⁸ and R⁹, taken together, may form a ring by providing a straight or branched alkylene group of 1 to 18 carbon atoms,
R¹⁰, R¹¹ and R¹² are independently monovalent hydrocarbon groups, which optionally contain a hetero atom or a pair of R¹⁰ and R¹¹, a pair of R¹⁰ and R¹², or a pair of R¹¹ and R¹², taken together, may form a ring by providing a divalent hydrocarbon group, which optionally contain a hetero atom.

2. A photoresist composition comprising the polymer of claim 1.

3. A process for forming a pattern, comprising the steps of:
applying the resist composition of claim 2 onto a substrate to form a coating,
heat treating the coating and exposing the coating to high energy radiation with a wavelength of up to 300 nm or electron beam through a photo-mask,
optionally heat treating the exposed coating, and developing the coating with a developer.

4. The process of claim 3, wherein the exposing of the coating is by deep-UV rays having a wavelength of 120 to 254 nm to produce fine pattern formation.

5. A chemical amplification, positive resist composition comprising
(A) the polymer of claim 1,
(B) an organic solvent, and
(C) a photoacid generator.

6. The resist composition of claim 5 further comprising (E) a basic compound.

7. The resist composition of claim 5 further comprising (F) a dissolution inhibitor.

8. A chemical amplification, negative resist composition comprising
(A) the polymer of claim 1,
(B) an organic solvent,
(C) a photoacid generator, and
(D) a crosslinker.

9. The resist composition of claim 8 further comprising (E) a basic compound.

10. The resist composition of claim 8 further comprising (F) a dissolution inhibitor.

11. The polymer of claim 1, having a weight average molecular weight of about 1,000 to 1,000,000.

12. The polymer of claim 1, having a weight average molecular weight of about 2,000 to 100,000.

13. A polymer comprising recurring units of the following general formula (2):

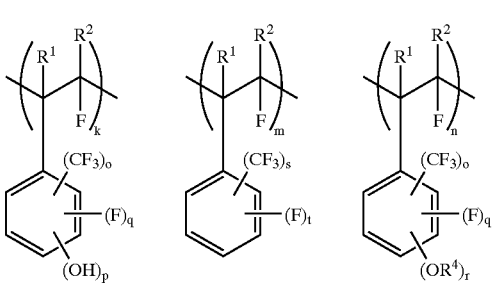

wherein
R¹ is hydrogen, fluorine or an unsubstituted or fluorinated, straight, branched or cyclic alkyl group of 1 to 20 carbon atoms,
R² is fluorine or an unsubstituted or fluorinated, straight, branched or cyclic alkyl group of 1 to 20 carbon atoms,
R⁴ is an acid labile group,
letters o, p, q, r, s and t are numbers in the range: $0 \leq o < 5$, $0 < p \leq 5$, $0 \leq q < 5$, $0 \leq r \leq 5$, $0 \leq s \leq 5$, $0 \leq t \leq 5$, $0 < o+q < 5$, and $0 \leq s+t \leq 5$, k, m and n are numbers in the range: $0 < k < 1$, $0 \leq m < 1$, and $0 \leq n < 1$.

14. The polymer of claim 13, wherein letter n and r are more than 0 and the polymer contains at least one OR⁴ group wherein the acid labile group represented by R⁴ is selected from the group consisting of groups of the following formulae (3) and (4), tertiary alkyl groups with 4 to 40 carbon atoms of the following formula (5), trialkylsilyl groups whose alkyl groups each have 1 to 6 carbon atoms, and oxoalkyl groups of 4 to 20 carbon atoms,

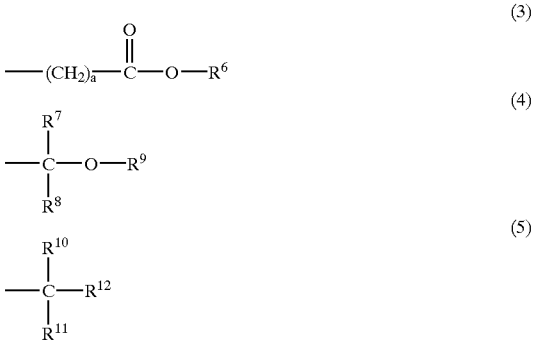

wherein,
R⁶ is a tertiary alkyl group of 4 to 20 carbon atoms, a trialkylsilyl group whose alkyl groups each have 1 to 6 carbon atoms, an oxoalkyl group of 4 to 20 carbon atoms or a group of formula (5),
letter a is an integer of 0 to 6,
R⁷ and R⁸ are independently hydrogen or straight, branched or cyclic alkyl groups of 1 to 18 carbon atoms,
R⁹ is a monovalent hydrocarbon group of 1 to 18 carbon atoms, which optionally has a hetero atom, or a pair of $R^7$ and $R^8$, a pair of $R^7$ and $R^9$, or a pair of $R^8$ and $R^9$, taken together, may form a ring by providing a straight or branched alkylene group of 1 to 18 carbon atoms, $R^{10}$, $R^{11}$ and $R^{12}$ are independently monovalent hydrocarbon groups, which optionally contain a hetero atom or a pair of $R^{10}$ and $R^{11}$, a pair of $R^{10}$ and $R^{12}$, or a pair of $R^{11}$ and $R^{12}$, taken together, may form a ring by providing a divalent hydrocarbon group, which optionally contain a hetero atom.

15. A photoresist composition comprising a polymer according to claim 2.

16. A process for forming a pattern, comprising the steps of:

applying the resist composition of claim 15 onto a substrate to form a coating, heat treating the coating and exposing the coating to high energy radiation with a wavelength of up to 300 nm or electron beam through a photo-mask, optionally heat treating the exposed coating, and developing the coating with a developer.

17. The process of claim 16, wherein the exposing of the coating is by deep-UV rays having a wavelenght of 120 to 254 nm to produce fine pattern formation.

18. A chemical amplification, positive resist composition comprising (A) the polymer of claim 2, (B) an organic solvent, and (C) a photoacid generator.

19. The resist composition of claim 18, further comprising (E) a basic compound.

20. The resist composition of claim 18, further comprising (F) a dissolution inhibitor.

21. The resist composition of claim 18, further comprising (E) a basic compound.

22. The resist composition of claim 18, further comprising (F) a dissolution inhibitor.

23. A chemical amplification, negative resist composition comprising (A) the polymer of claim 2, (B) an organic solvent, (C) a photoacid generator, and (D) a crosslinker.

24. The resist composition of claim 23, further comprising (E) a basic compound.

25. The resist composition of claim 23, further comprising (F) a dissolution inhibitor.

26. The resist composition of claim 23, further comprising (E) a basic compound.

27. The resist composition of claim 23, further comprising (F) a dissolution inhibitor.

28. The polymer of claim 2, having a weight average molecular weight of about 1,000 to 1,000,000.

29. The polymer of claim 2, having a weight average molecular weight of about 2,000 to 100,000.

30. A photoresist composition comprising a polymer comprising a polystyrene derivative of a fluorinated backbone having recurring units of the following formula (1):

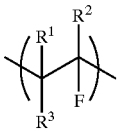

wherein $R^1$ is hydrogen, fluorine or an unsubstituted or fluorinated, straight, branched or cyclic alkyl group of 1 to 20 carbon atoms, $R^2$ is fluorine or an unsubstituted or fluorinated, straight, branched or cyclic alkyl group of 1 to 20 carbon atoms, and $R^3$ is an aryl group of 6 to 20 carbon atoms optionally having attached thereto a hydroxyl group or an $OR^4$ group wherein $R^4$ is an acid labile group, or both.

31. A process for forming a pattern, comprising the steps of:

applying the resist composition of claim 20 onto a substrate to form a coating, heat treating the coating and exposing the coating to high energy radiation with a wavelength of up to 300 nm or electron beam through a photo-mask, optionally heat treating the exposed coating, and developing the coating with a developer.

32. The process of claim 31, wherein the exposing of the coating is by deep-UV rays having a wavelength of 120 to 254 nm to produce fine pattern formation.

33. A chemical amplification, positive resist composition comprising (A) a polymer comprising a polystyrene derivative of a fluorinated backbone having recurring units of the following formula (1):

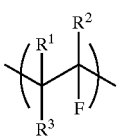

wherein $R^1$ is hydrogen, fluorine or an unsubstituted or fluorinated, straight, branched or cyclic alkyl group of 1 to 20 carbon atoms, $R^2$ is fluorine or an unsubstituted or fluorinated, straight, branched or cyclic alkyl group of 1 to 20 carbon atoms, and $R^3$ is an aryl group of 6 to 20 carbon atoms optionally having attached thereto a hydroxyl group or an $OR^4$ group wherein $R^4$ is an acid labile group, or both, (B) an organic solvent, and (C) a photoacid generator.

34. A chemical amplification, negative resist composition comprising (A) a polymer comprising a polystyrene derivative of a fluorinated backbone having recurring units of the following formula (1):

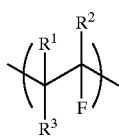 (1)

wherein
R¹ is hydrogen, fluorine or an unsubstituted or fluorinated, straight, branched or cyclic alkyl group of 1 to 20 carbon atoms, R² is fluorine or an unsubstituted or fluorinated, straight, branched or cyclic alkyl group of 1 to 20 carbon atoms, and R³ is an aryl group of 6 to 20 carbon atoms optionally having attached thereto a hydroxyl group or an OR⁴ group wherein R⁴ is an acid labile group, or both, (B) an organic solvent,
(C) a photoacid generator, and
(D) a crosslinker.

* * * * *